United States Patent
Wei et al.

(10) Patent No.: US 6,537,907 B1
(45) Date of Patent: Mar. 25, 2003

(54) SELF SIDEWALL ALUMINUM FLUORIDE, (SSWAF), PROTECTION

(75) Inventors: Horn-Jer Wei, Taipei (TW); Nien-Huai Kuan, Shin-chu (TW); Chi-Hsin Lo, Ping Jeng (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/950,226

(22) Filed: Sep. 10, 2001

(51) Int. Cl.$^7$ .......................................... H01L 21/4763
(52) U.S. Cl. ....................................................... 438/636
(58) Field of Search ......................................... 438/636

(56) References Cited

U.S. PATENT DOCUMENTS

| | | | |
|---|---|---|---|
| 5,066,615 A | * 11/1991 | Brady et al. | 438/636 |
| 5,217,570 A | 6/1993 | Kadomura | 156/665 |
| 5,360,510 A | 11/1994 | Kadomura | 156/665 |
| 5,540,812 A | 7/1996 | Kadomura | 156/652.1 |
| 5,578,163 A | 11/1996 | Yachi | 156/643.1 |
| 5,976,973 A | * 11/1999 | Ohira et al. | 438/645 |
| 6,017,826 A | 1/2000 | Zhou et al. | 438/720 |

OTHER PUBLICATIONS

Stanley Wolf Silicon Processing for the VSLI ERA vol. 1 Lattice Press 1986 pp. 332 and 367.*

* cited by examiner

Primary Examiner—Carl Whitehead, Jr.
Assistant Examiner—David S Blum
(74) Attorney, Agent, or Firm—George O. Saile; Stephen B. Ackerman

(57) ABSTRACT

A process for defining an aluminum based structure, on an underlying titanium nitride shape, via use of a two step dry etching procedure, has been developed. A first iteration of the two step dry etching process features initial definition of the aluminum based structure, on an underlying titanium nitride layer, using a photoresist shape as an etch mask, performed in a chlorine based environment, with the first dry etching step terminating at the appearance of the titanium nitride layer. A second dry etching step features the introduction of a fluorine based etchant, to the chlorine based environment, forming a protective aluminum fluoride layer on the exposed sides of the aluminum based structure during definition of the titanium nitride shape. A second iteration of the two step dry etching process features the removal of the masking photoresist shape after definition of the aluminum based structure, via the first dry etching step. The introduction of the fluorine based etchant during the second dry etching step, protects all exposed surfaces of the defined aluminum based structure, allowing definition of the titanium nitride shape, during the second dry etching step, using the aluminum based structure as an etch mask.

10 Claims, 3 Drawing Sheets

SELF SIDEWALL ALUMINUM FLUORIDE, (SSWAF), PROTECTION

BACKGROUND OF THE INVENTION (1) Field of the Invention

The present invention relates to methods used to fabricate semiconductor devices, and more specifically to a method used to define a metal interconnect structure.

(2) Description of Prior Art

Micro-miniaturization, or the ability to fabricate semiconductor devices using sub-micron features, have resulted in increasing semiconductor device performance, as well as decreasing processing costs for a specific semiconductor chip. Specific semiconductor fabrication disciplines, such as photolithography, and dry etching, have allowed micro-miniaturization to be realized. The development of more sophisticated exposure cameras as well as the use of more sensitive photoresist materials, have allowed sub-micron features, as small as 0.25 um, to be routinely defined in photoresist layers. In addition the advent of advanced dry etching tools and processes have allowed the photoresist sub-micron features to be successfully transferred to underlying materials, such as metal layers, used for conductive features for advanced semiconductor devices. However when an aluminum based layer, overlying a barrier layer, such as titanium nitride, is to be patterned to create a narrow width, (0.25 um), metal interconnect structure for a semiconductor device, specific dry etching processes have to be used to avoid lateral etching, or undercutting of the aluminum based layer, during the definition of the underlying barrier layer.

This invention will describe a novel dry etching sequence in which the etch chemistry is changed, after definition of the narrow width, aluminum based interconnect structure, to allow the underlying barrier layer to be defined without attacking the already defined, overlying, narrow width aluminum based interconnect structure. This is accomplished by the addition of a fluorine containing component to the etch ambient, resulting in the formation of a sidewall layer on the exposed sides of the aluminum based interconnect structure, protecting the aluminum based structure from the etching sequence used to define the desired narrow width pattern in the underlying barrier layer. Subsequent removal of the photoresist pattern, also removes the protective sidewall layer. Prior art, such as Kadomura, in U.S. Pat. No. 5,217,570, describes a process sequence in which an aluminum layer, and an underlying barrier layer, are defined via dry etching procedures, however that prior art does not feature the unique in situ dry etching sequence, and details, supplied in the present invention.

SUMMARY OF THE INVENTION

It is an object of this invention to define a narrow width, metal interconnect structure, in a composite layer comprised of an overlying aluminum based layer, and an underlying barrier layer, via a two step, dry etching procedure.

It is another object of this invention to initially define the desired narrow width pattern in the aluminum based layer, using a chlorine based etchant, followed by the in situ addition of a fluorine based etchant, resulting in the formation of a self sidewall aluminum fluoride, (SSWAF), layer on the exposed sides of the defined aluminum based component, during the patterning of the underlying barrier layer.

It is still another object of this invention to remove the defining photoresist pattern after definition of the desired pattern in the aluminum based component, followed by definition of the underlying barrier layer, in the fluorine containing etchant, using the aluminum based structure as an etch mask, with the fluorine containing etchant allowing the formation of the protective SSWAF layer, on the sides, as well as on the top surface of the defined aluminum based structure, to be realized during the patterning of the underlying barrier layer.

In accordance with the present invention a method of defining an aluminum based interconnect structure, on an underlying barrier layer shape, featuring a first step used to define a pattern in the aluminum based layer, and featuring a second step, used to form a protective layer on the sides of the defined aluminum based component during the definition of the underlying barrier layer shape, is described. A first iteration of this invention features the use of a photoresist shape, used to define the desired narrow width pattern in an aluminum based layer, using a chlorine based etchant. With the photoresist shape in place, a fluorine based etchant is added to the chlorine based etchant, resulting in the formation of the SSWAF layer on the exposed sides of the defined aluminum based structure, during the patterning of the underlying barrier layer. Removal of the photoresist shape also results in removal of the SSWAF layer.

A second iteration of this invention features the use of a photoresist shape as an etch mask during the definition of the desired narrow width pattern in the aluminum based layer, via use of a chlorine based etchant. After removal of the photoresist shape a fluorine based etchant is added to the chlorine based etchant, allowing definition of the underlying barrier layer shape to be accomplished, during the simultaneous formation of the protective SSWAF layer, on all exposed regions of the aluminum based structure.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The method of forming an aluminum based interconnect structure, on an underlying barrier shape, featuring a two step dry etching procedure which forms a protective layer on the exposed sides of the aluminum based interconnect structure, during the patterning of the underlying barrier layer, will now be described in detail. A first iteration of this invention, entailing a photoresist shape used as an etch mask for both steps of the two step dry etching procedure, will be first addressed and schematically shown using FIGS. 1–4.

Figure 1:
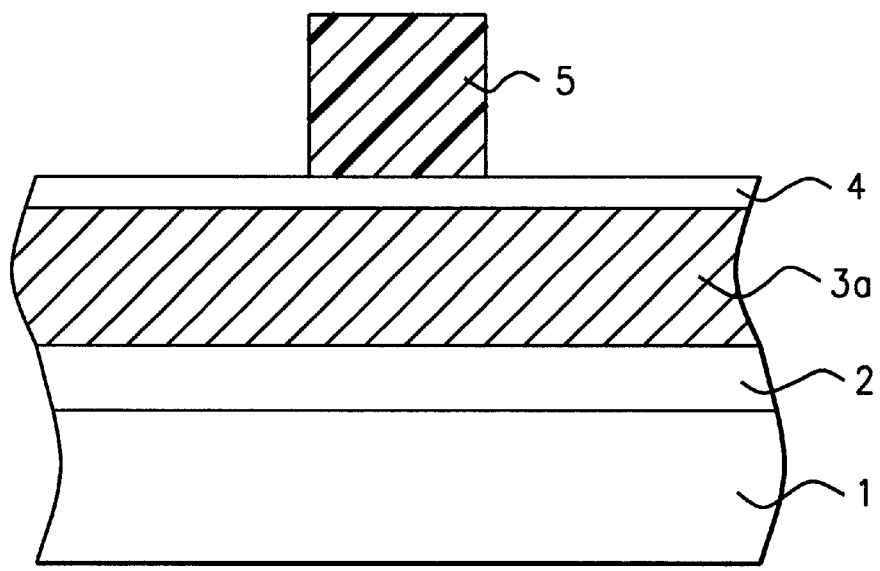
FIGS. 1–4, which schematically, in cross-sectional style, describe key stages of fabrication, used for a first iteration of this invention, resulting in definition of a composite interconnect structure, comprised of an overlying narrow width metal interconnect structure, on an underlying barrier structure, without degradation, or undercut of the narrow width metal interconnect structure.

Barrier layer 2, comprised of titanium nitride, is deposited using plasma vapor deposition, (PVD), procedures, at a thickness between about 1000 to 2000 Angstroms. A portion of barrier layer 2, is shown in FIG. 1, overlying insulator layer 1, however another portion of barrier layer 2, not shown in FIG. 1, can be contacting an underlying conductive region, such as a lower level metal interconnect structure, or a conductive plug structure, exposed in an opening in insulator layer 1. Aluminum based layer 3a, is next deposited, via PVD procedures, to a thickness between about 4000 to 12000 Angstroms. Aluminum based layer 3a, contains copper, at a weight percent between about 0 to 1.0, and can also be comprised with silicon, at a weight percent between about 0 to 0.1. An anti-reflective coating, (ARC), layer 4, comprised of titanium nitride, or comprised of an organic material, is next deposited, or applied on the top surface of aluminum based layer 3a, to a thickness between about 100 to 500 Angstroms. Photoresist shape 5, at a thickness between about 1.0 to 2.0 um, is then formed with a width between about 0.10 to 1.0 um, to subsequently be used as an etch mask during the two step dry etching procedure, to define a narrow width aluminum based interconnect structure, on an underlying barrier layer shape. The results of the deposition of, and application of, the above layers, is schematically shown in FIG. 1.

Figure 2:
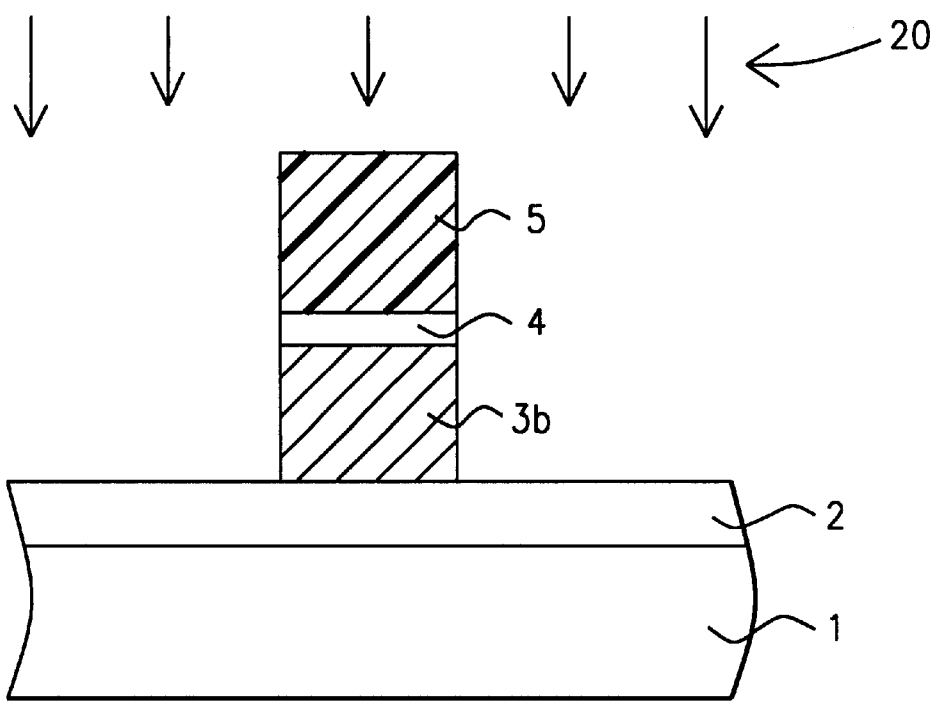

The first dry etching step, of the two step procedure, is next addressed, and shown schematically in FIG. 2. A chlorine based etchant, such as $Cl_2$, is introduced into a dry etching tool, at a flow between about 40 to 50 sccm, and with an R.F. power between about 450 to 550 watts, the narrow width pattern of photoresist shape 5, is defined in ARC layer 4, and in aluminum based layer 3a, resulting in narrow width aluminum based structure 3b. The etch rate ratio of the aluminum based layer 3a, to titanium nitride barrier layer 2, in chlorine environment 20, is between about 1.2 to 2, to 1, resulting in the first dry etching step terminating at the appearance of titanium nitride barrier layer 2. The product resulting from the patterning of aluminum based layer 3a, is a volatile $AlCl_x$, pumped out of the dry etching tool during the first dry etching step. Therefore if this etching cycle were continued in an attempt to slowly define the overlying pattern in underlying barrier layer 2, the exposed sides of aluminum based structure 3b, would be attacked, resulting in undesirable lateral undercut.

Figure 3:
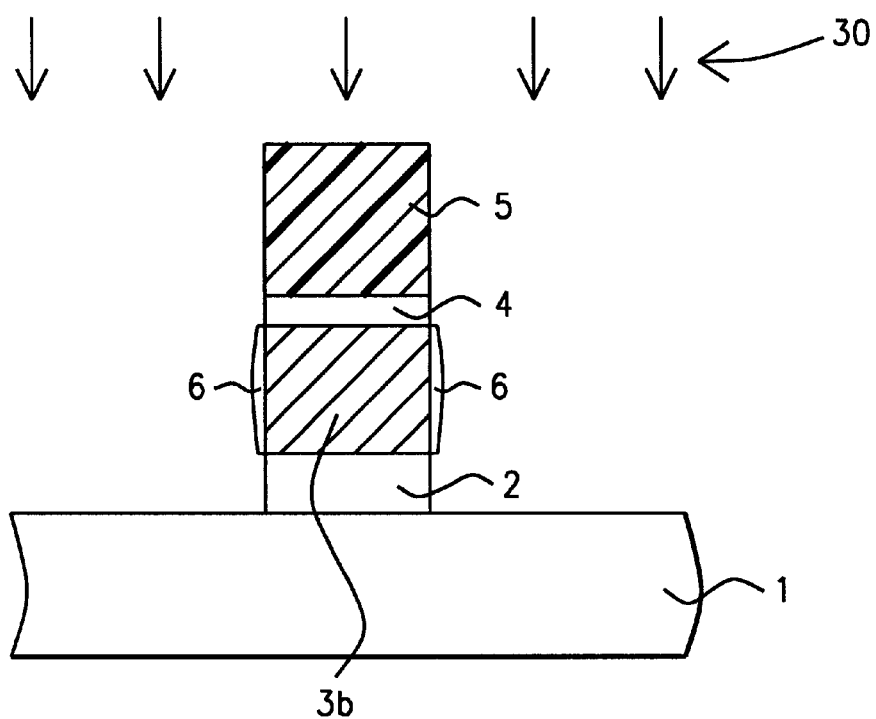
Figure 4:
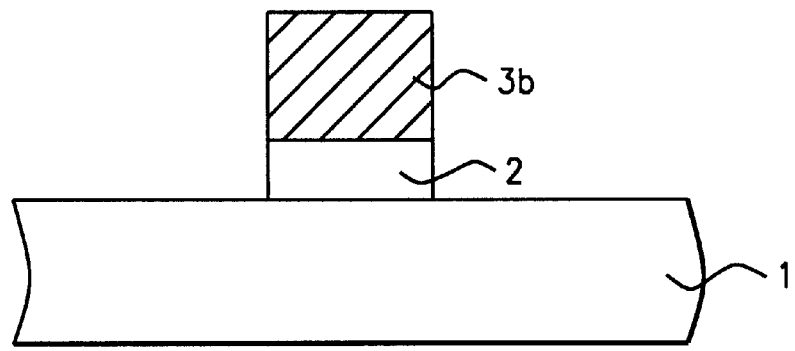

A second dry etching step is therefore performed in situ, featuring the introduction of a fluorine based etchant, such as $CF_4$, at a flow between about 20 to 30 sccm, resulting in the $Cl_2$–$F_2$ etching environment 30, shown schematically in FIG. 3. The second dry etching step, in dry etching environment 30, again performed at an R.F. power between about 40 to 50 watts, removes titanium nitride barrier layer 2, at a rate between about 8000 to 9000 Angstroms/min, while etching aluminum based structure 3b, at a rate less than 100 Angstroms/min, thus avoiding lateral etching of the already defined aluminum based structure. The low etch rate of aluminum based material in dry etching environment 30, is a result of the self sidewall aluminum fluoride, (SSWAF), $AlF_x$ layer 6, forming on the exposed sides of aluminum based structure 3b, protecting aluminum based structure 6, during the patterning of titanium nitride barrier layer 2. The thickness of $AlF_x$ layer 6, formed during the second dry etching step is between about 0 to 100 Angstroms. Photoresist shape 5, is then removed via plasma oxygen ashing and careful wet cleans, with this procedure also removing organic ARC layer 4, as well as oxidizing, and volatilizing, $AlF_x$ layer 6. The resulting narrow width, aluminum based structure 3b, overlying titanium nitride barrier layer shape 2, is schematically shown in FIG. 4. If an non-organic ARC layer such as TiN were used in place of an organic ARC layer, the TiN ARC, would also be removed during removal of photoresist shape 5.

Figure 5:
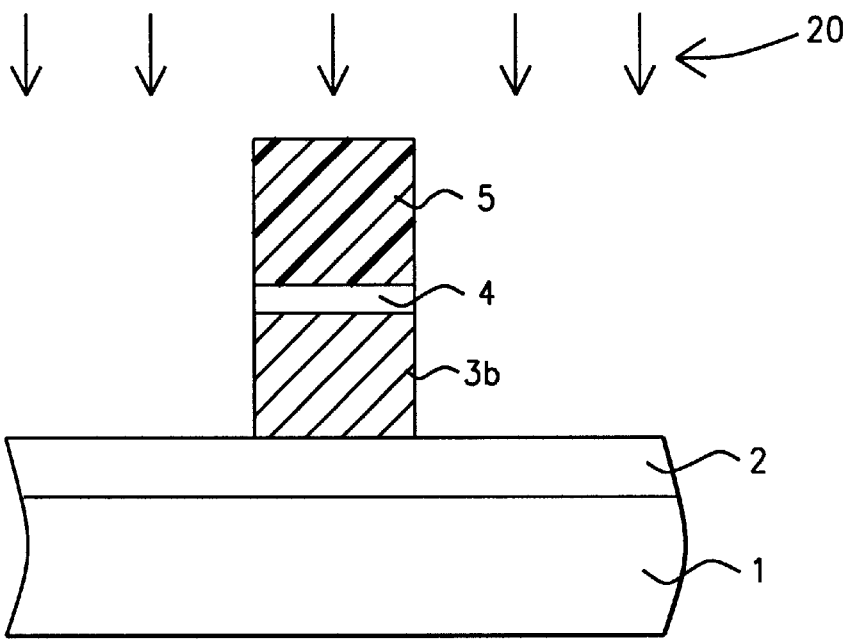
FIGS. 5–7, which schematically, in cross-sectional style, describe key stages of fabrication, used for a second iteration of this invention, again allowing the patterning of a composite interconnect structure, comprised of an overlying, narrow width metal interconnect structure, on an underlying barrier structure, to be obtained, without degradation or undercut of the narrow width metal interconnect structure.
Figure 6:
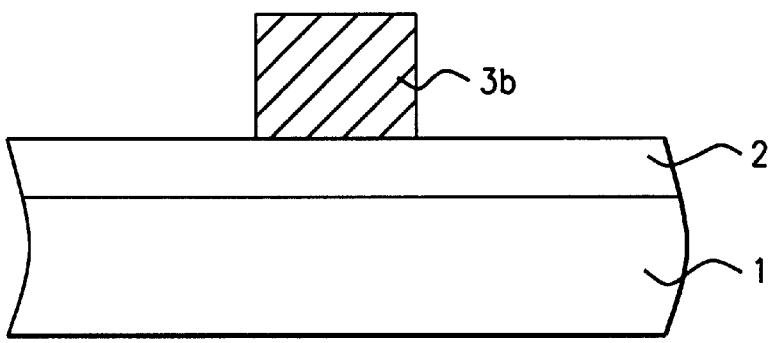
Figure 7:
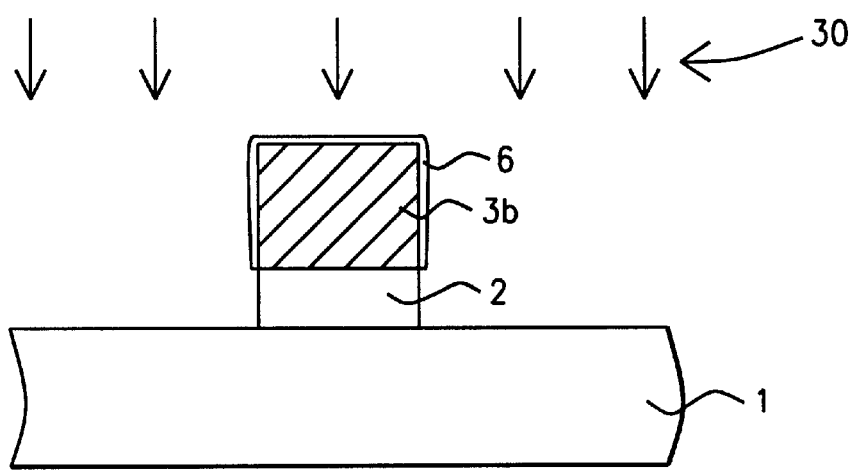

A second iteration of this invention, featuring the removal of photoresist shape 5, prior to performing the second dry etching procedure of the two step dry etching procedure, is next described and schematically shown in FIGS. 5–7. FIG. 5, schematically shows the result of performing the first dry etching procedure in chlorine containing, dry etching environment 20, resulting in the desired narrow width, aluminum based structure 3b. At this stage photoresist shape 5, as well as organic ARC layer 4, are removed via plasma oxygen ashing and careful wet cleans. This is schematically shown in FIG. 6. Aluminum based interconnect structure 3b, is then used as an etch mask allowing definition of titanium nitride barrier layer 2, to be accomplished via in second dry etching environment 30. Second dry etching environment 30, is again comprised with between about 20 to 30 sccm of $CF_4$, resulting in a removal rate of titanium nitride barrier layer 2, between about 8000 to 9000 Angstroms/min. The formation of $AlF_x$ layer 6, on the sides of, as well as on the top surface of aluminum based structure 3b, protects this structure during the second dry etching step, allowing the aluminum based structure 3b, to behave as the etch mask, allowing the narrow width pattern of aluminum based structure 3b, to be successfully transferred to underlying titanium nitride barrier layer 2, without the use of a masking, overlying photoresist shape. This is schematically shown in FIG. 7. If desired $AlF_x$ can now be removed from the surfaces of aluminum based structure 3b, via conventional photoresist strip procedures, such as a plasma oxygen ashing procedure.

While this invention has been particularly shown and described with reference to, the preferred embodiments thereof, it will be understood by those skilled in the art that various changes in form and details may be made without departing from the spirit and scope of this invention

What is claimed is:

1. A method of forming a composite metal interconnect structure comprised of an overlying aluminum based structure on an underlying titanium nitride shape, wherein an aluminum fluoride layer formed on the sides and on the top of said underlying titanium nitride shape is used as an etch mask for definition of said underlying titanium nitride shape, comprising the steps of:

depositing a titanium nitride layer;

depositing an aluminum based layer on said titanium nitride layer;

applying an anti-reflective coating, (ARC), layer, on said aluminum based layer;

forming a narrow width, photoresist shape on said ARC layer;

performing a first dry etching step of a two step dry etching procedure in a first dry etching environment comprised with a chlorine containing etchant, using said photoresist shape to define said aluminum based structure on said titanium nitride layer;

removing said narrow width, photoresist shape, and said ARC layer; and performing a second dry etching procedure of said two step dry etching procedure in a second dry etching environment comprised with said chlorine containing etchant and comprised with a fluorine containing etchant, forming said aluminum fluoride layer on the top surface and on the sides of said aluminum based structure, while simultaneously defining said underlying titanium nitride shape using said aluminum based structure, comprised with a top surface covered by said aluminum fluoride layer, as an etch mask.

2. The method of claim 1 wherein said titanium nitride layer is obtained via plasma vapor deposition, (PVD), procedures at a thickness between about 1000 to 2000 Angstroms.

3. The method of claim 1, wherein said aluminum based layer is obtained via PVD procedures at a thickness between about 4000 to 12000 Angstroms, comprised with copper at a weight percent between about 0 to 1.0, and comprised with silicon at a weight percent between about 0 to 1.0.

4. The method of claim 1, wherein said ARC layer is comprised of titanium nitride is applied, or deposited at a thickness between about 100 to 500 Angstroms.

5. The method of claim 1, wherein said narrow width, photoresist shape is formed to a thickness between about 1.0 to 2.0 um, with a width between about 0.1 to 1.0 um.

6. The method of claim 1, wherein said first dry etching step is performed in a dry etching tool at an R.F. power between about 450 to 550 watts.

7. The method of claim 1, wherein said first dry etching environment is comprised with said chlorine containing etchant, such as $Cl_2$, at a flow between about 40 to 50 sccm, with the etch rate ratio of said aluminum based layer to said titanium nitride layer, between about 1.2 to 2, to 1.

8. The method of claim 1, wherein said second dry etching step is performed in a dry etching tool at an R.F. power between about 400 to 500 watts.

9. The method of claim 1, wherein said second dry etching environment is comprised of said chlorine containing etchant, such as $Cl_2$, at a flow between about 40 to 50 sccm, and comprised of said fluorine containing etchant, such as $CF_4$, at a flow between about 20 to 30 sccm, with an etch rate of said titanium nitride layer between about 8000 to 9000 Angstroms/min, and with an etch rate of said aluminum based structure of less than 100 Angstroms/min.

10. The method of claim 1, wherein said aluminum fluoride layer, formed on the sides of said aluminum based structure during said second dry etching step, is formed to a thickness between about 0 to 100 Angstroms.

* * * * *